(12) United States Patent
Kaneko et al.

(10) Patent No.: US 6,738,034 B2
(45) Date of Patent: May 18, 2004

(54) PICTURE IMAGE DISPLAY DEVICE AND METHOD OF DRIVING THE SAME

(75) Inventors: Yoshiyuki Kaneko, Hachioji (JP); Sukekazu Aratani, Hitachiota (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/821,022

(22) Filed: Mar. 30, 2001

(65) Prior Publication Data

US 2001/0055828 A1 Dec. 27, 2001

(30) Foreign Application Priority Data

Jun. 27, 2000 (JP) ........................ 2000-192824

(51) Int. Cl.[7] ............... G09G 3/30; G09G 3/32; G09G 3/34
(52) U.S. Cl. ........................... 345/76; 82/84
(58) Field of Search .................. 345/44–46, 55, 345/76–84

(56) References Cited

U.S. PATENT DOCUMENTS 5,708,452 A * 1/1998 Takahashi .................... 345/55
5,903,246 A * 5/1999 Dingwall ..................... 345/46
5,923,308 A * 7/1999 Wei et al. ..................... 345/44
5,952,789 A * 9/1999 Stewart et al. ............. 315/169.1
5,986,632 A * 11/1999 Takayama et al. ........... 345/100
6,215,244 B1 * 4/2001 Kuribayashi et al. ........ 313/505
6,229,508 B1 * 5/2001 Kane ........................... 345/205
6,392,620 B1 * 5/2002 Mizutani et al. .............. 345/88

* cited by examiner

Primary Examiner—Richard Hjerpe
Assistant Examiner—Duc Dinh
(74) Attorney, Agent, or Firm—Antonelli, Terry, Stout & Kraus, LLP

(57) ABSTRACT

Pixels in a picture image display device are driven in such a manner that while introducing light, a quenching period is initiated in which electro optical elements in the pixels are quenched after scanning a plurality of gate lines for displaying one picture image. In other words, the pixels are driven while interposing the light quenching period in which the electro optical elements are quenched between one frame and a subsequent frame. Thereby, the phenomenon of blurred edges at the time of motion picture display, when the pixels including the electro optical elements are driven through an active matrix drive circuit, is suppressed and the picture quality of the picture image display device is improved.

11 Claims, 11 Drawing Sheets

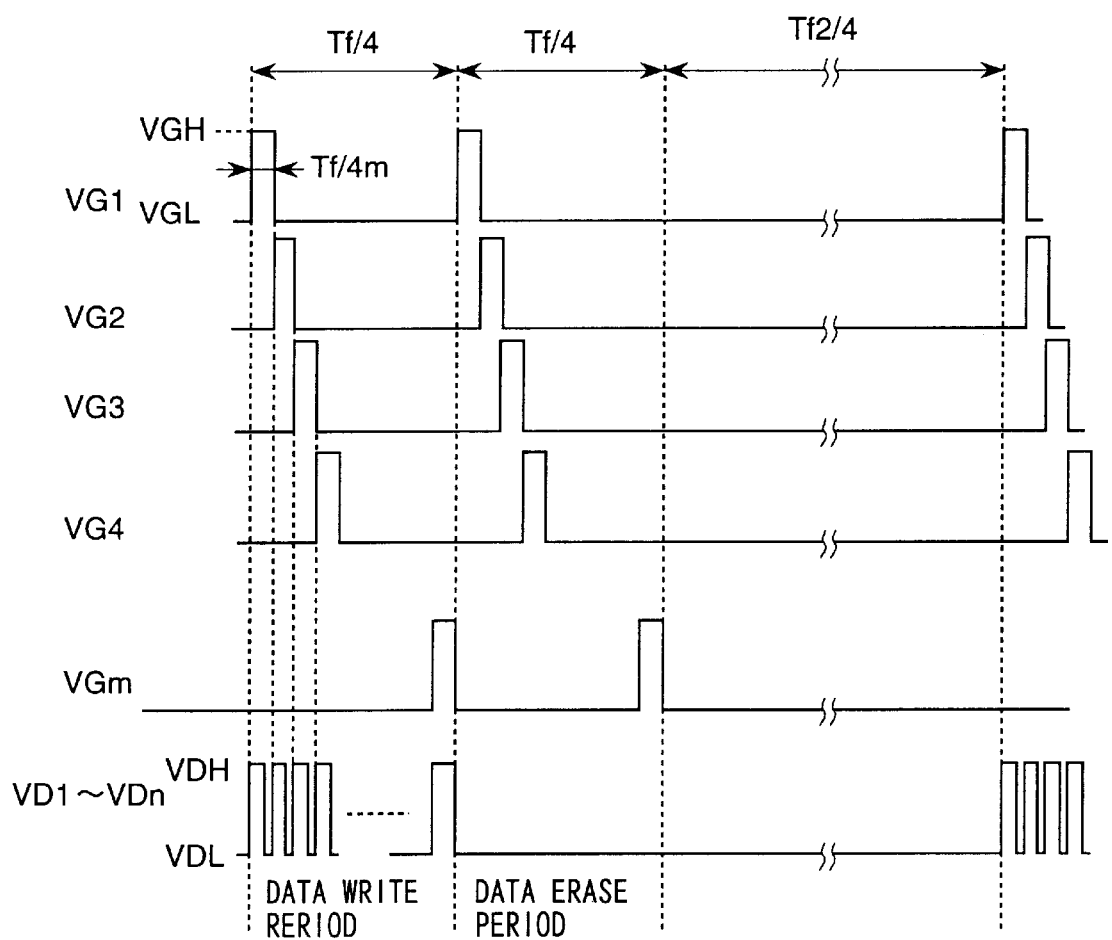

PICTURE IMAGE DISPLAY DEVICE AND METHOD OF DRIVING THE SAME

BACKGROUND OF THE INVENTION

1. Field of the Invention

The present invention relates to an active matrix type picture image display device and a method of driving the same in which a light emitting operation of an electro optical element of which emission is caused by flowing a drive current through a light emitting thin film such as an organic semiconductor film is controlled by switching elements such as thin film transistors (hereinbelow will be referred to as TFTs).

2. Conventional Art

In response to coming of a highly information oriented society, demands of such as personal computers, car navigation devices, portable information terminals, information communication products and combined devices thereof are increasing these days. For these products thin and light weighted displays with low electric power consumption are suitable, therefore, liquid crystal display devices or display devices including self light emitting type electro optical elements such as electro luminescence elements (hereinbelow will be referred to as ELs) and light emitting diode elements (hereinbelow will be referred to as LEDs) are how used.

Since the latter display devices including the self light emitting type electro optical elements show such advantages as of high visibility, broad visual angle and high response characteristics which are suitable for displaying motion pictures, the latter display devices are recognized particularly as suitable in the future, because video image display will become major importance. In particular, a rapid improvement in light emitting efficiency in these days of organic EL elements and organic LED elements (hereinbelow will be called inclusively as OLEDs) using an organic substance as a light emitting layer and development in network technology which permits video image signal communication in combination increase more and more an expectation for OLED displays.

In order to enhance power efficiency in OLED displays an active matrix drive by means of thin film transistors is effective which will be explained later. Art in which an OLED display is constituted in an active matrix structure and is driven therewith is, for example, disclosed in JP-A-4-328791 (1992), JP-A8-241048 (1996) and U.S. Pat. No. 5,550,066, and further, art relating to a drive voltage of such OLED display is, for example, disclosed in PCT application laid-open No. WO98/36407.

In a typical pixel in an OLED display the light emitting intensity of an OLED element is controlled by an active matrix element drive circuit which is constituted by two TFTs (one is for a switching transistor and the other is for a driver transistor) and one capacitor. Pixels are arranged near respective cross points of m lines and n rows matrix which is formed by n pieces of data lines to which picture image signals are fed and m pieces of scanning lines (or gate lines) to which scanning signals are fed.

In order to drives the pixels, through successive application of scanning signals (or gate voltages) onto the gate lines of m lines, the respective switching transistors are turned on to complete scanning in vertical direction once in one frame period Tf, and a turn on voltage is again applied to the first gate line.

In the above pixel drive scheme, an interval when the turn-on voltage is applied on a single gate line gives below Tf/m. As a value for one frame period Tf about 1/60 sec is generally employed. At the time when a turn-on voltage is being applied on a certain gate line, all of the switching transistors connected to the certain gate line are rendered into a on state, and in synchronism therewith picture image signals (data voltages) are applied at the same time to data lines of n rows, which is called as line-at-a-time scanning method and commonly used in the field of active matrix type liquid crystal display devices.

The data voltage is stored in the capacitor during the time when the turn-on voltage is applied to the gate line and is kept there at substantially the same value during one frame period. The voltage value at the capacitor defines the gate voltage of the driver transistor, thus the value of current flowing through the driver transistor is regulated so as to flow a predetermined current through the OLED element and to cause light emission. Response time of an OLED element of starting light emission after a voltage is applied is usually below 1 $\mu$s, therefore, the OLED element can be operated so as to follow a swift motion picture image (motion picture).

Now, with the active matrix drive a high efficiency is realized, because the light emission is effected during the entire one frame period. When comparing this active matrix drive with a simple matrix drive in which an OLED element is driven by connecting the respective diode electrodes thereof to a vertical scanning line and a horizontal scanning line without providing the TFTs, the difference of the efficiency is significant.

In the simple matrix drive, the current flows through the OLED element only the period when the vertical scanning line is selected, therefore, in order to obtain a brightness equivalent to a light emission in the one frame period only with such a short period light emission a light emission intensity multiplied by about vertical scanning line number is necessitated in comparison with that for the active matrix drive. For fulfilling such requirement the drive voltage and the drive current therefor have to be inevitably increased, which increases loss power consumption such as heating and can not prevent power efficiency reduction.

As will be apparent from the above, it is considered that the active matrix drive is superior over the simple matrix drive with regard to the lower power consumption. Because of the high speed response characteristics of the OLED elements it has been believed that such OLED elements are suitable for motion picture displays. However, the active matrix drive for such OLED elements according to the conventional art employs the same drive method as for the liquid crystal displays (LCDs), namely a hold type display method, in which the respective pixels are displayed, in other words the respective OLED elements are caused to light-emit, over one frame period.

Hidekazu Ishiguro et al. "Consideration on Motion Picture Quality of the Hold Type Display with an Octuple-rate CRT" (Technical Report of The Institute of Electronics, Information and Communication Engineers, EID 96-4 (1996-06), pp19–26) discloses that it is unavoidable in a LCD of such phenomenon that edges of a moving body are blurred during motion picture display due to the hold type display method.

Although the problem of blurred edge of motion picture images was pointed out with regard to the LCDs, the cause of the blurred edges is due to the hold type display method. Therefore, the same problem of blurred edges of motion picture images likely arises with regard to the active matrix driven OLED elements when such OLED elements are operated with the hold type display method.

As has been mentioned above, in the conventional art the blurred edges phenomenon during motion picture display when electro optical elements such as OLED elements are driven by the active matrix circuits was not taken into account which causes deterioration of the picture qualities thereof.

SUMMARY OF THE INVENTION

An object of the present invention is to provide a picture image display device and a method of driving the same which suppresses a blurred edge during motion picture display, when the electro optical elements included therein are driven through active matrix circuits, and improves the picture quality thereof.

A feature of the present invention is to drive pixels by interposing a quenching period in which the electro optical elements are quenched after scanning a plurality of gate lines for displaying one picture image. In other words, the present invention drives the pixels while forming the quenching period in which the electro optical elements are once quenched between one frame and the subsequent frame thereto.

In a preferred embodiment according to the present invention, the pixels are driven while forming a quenching period in which the electro optical elements therein are quenched within one frame period for displaying one picture image.

In the present invention, since the pixels are driven in such a manner that a quenching period of quenching the electro optical elements is formed after scanning a plurality of gate lines for displaying one picture image, integration of white background or background signals is eliminated at the time of line of sight movement during the quenching period, thus the blurred edges is prevented, in other words the display characteristics of motion pictures are greatly improved.

BRIEF DESCRIPTION OF THE DRAWINGS

FIG. 5 is a time chart for explaining the pixel driving operation of FIG. 4 embodiment according to the present invention;

DETAILED DESCRIPTION OF THE PREFERRED EMBODIMENTS

Embodiments according to the present invention will be explained with reference to the drawings. At first, the structure of the picture image display device will be explained, thereafter methods of driving the same will be explained.

Figure 1:
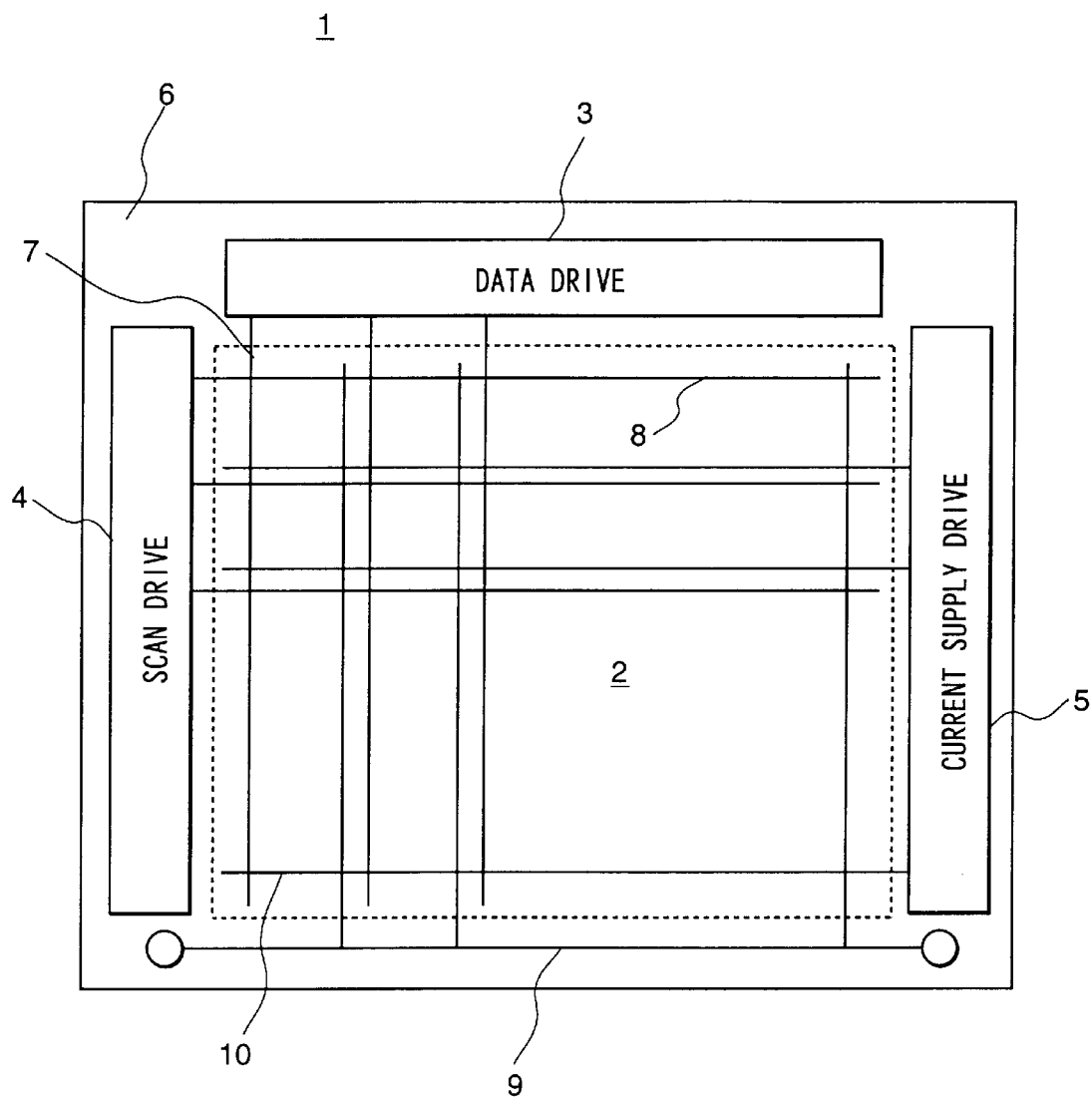
FIG. 1 is a block diagram showing an example of picture image display device to which the present invention is applied.
Figure 2:
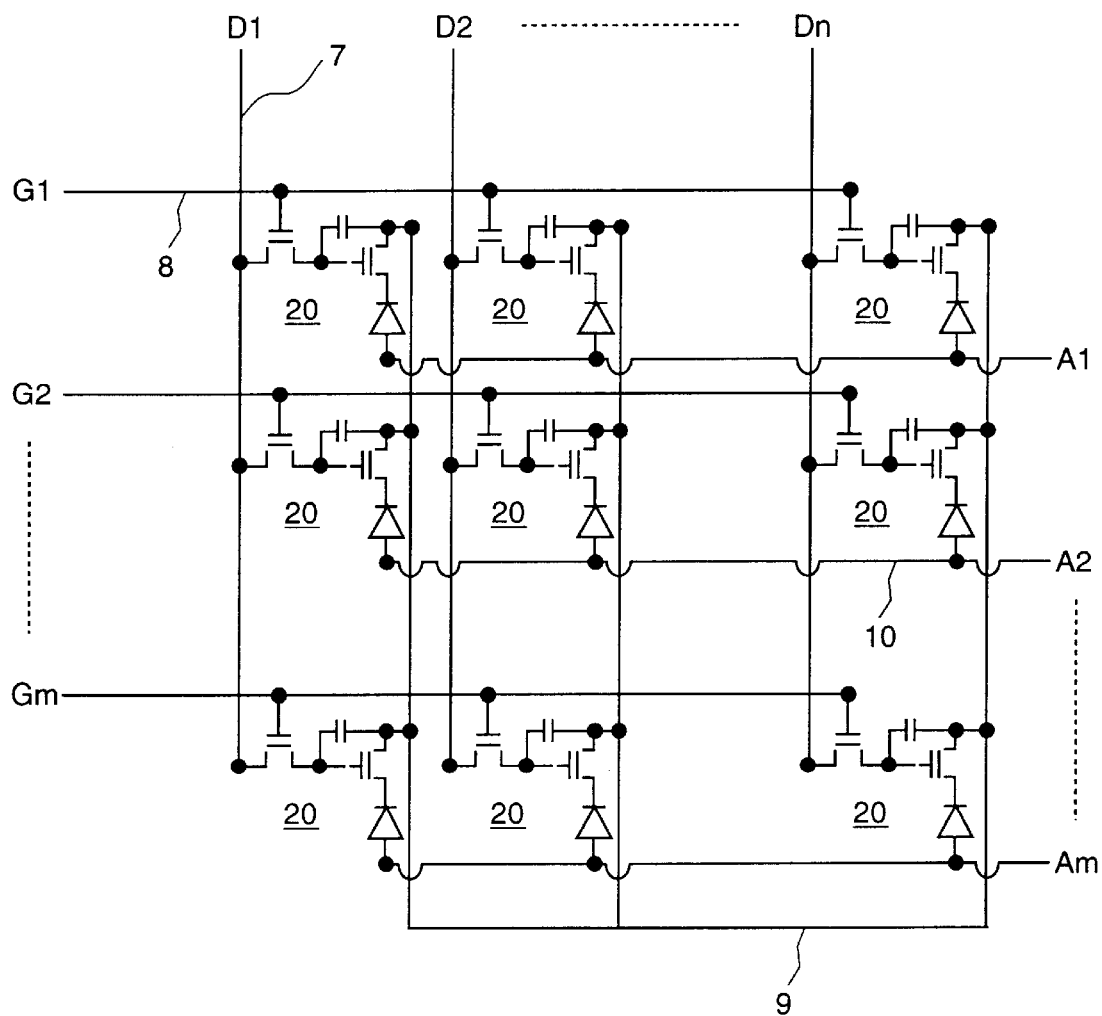
FIG. 2 is an equivalent circuit diagram of an active matrix type display unit included in FIG. 1 example.

FIG. 1 is a block diagram showing schematically an entire lay out of a picture image display device 1 and FIG. 2 is an equivalent circuit diagram of an active matrix drive structure constituted in a display portion 2 in FIG. 1.

In FIG. 1, the display portion 2 is constituted substantially at the center portion of a substrate 6 for the picture image display device 1. At the upper side of the display portion 2 a data line driving circuit 3 is provided for feeding picture image signals for data lines 7, and at the left side thereof a scanning line driving circuit 4 is provided for feeding scanning signals (gate voltage) for gate lines 8. Further, at the right side of the display portion 2 a current supply driving circuit 5 is provided. These driving circuits 3, 4 and 5 are respectively configured by such as a shift register circuit, a level shifter circuit and an analogue switching circuit, each constituted by a complementary type circuit including N channel type and P channel type TFTs.

Like an active matrix type liquid crystal display device, in the picture image display device 1 the plurality of gate lines 8 and the plurality of data lines which are extended in the direction crossing to the extending direction of the gate lines 8 are provided on the substrate 6. As illustrated in FIG. 2 pixels 20 are arranged in a matrix shape defined by the gate lines 8 such as G1, G2, . . . Gm and the data lines 7 such as D1, D2, . . . , Dn.

Figure 3:
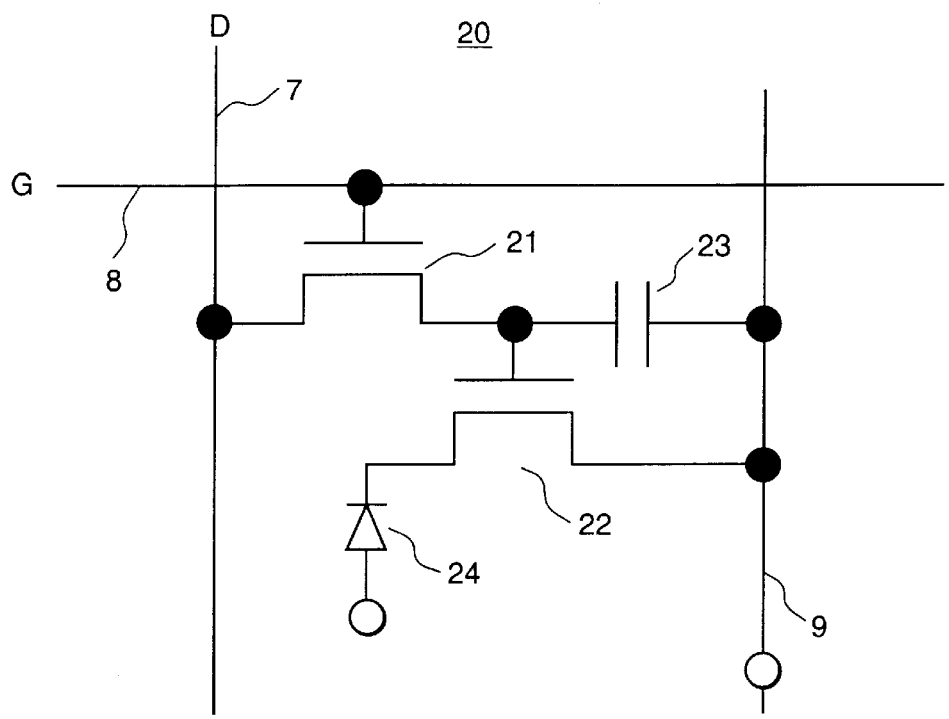
FIG. 3 is an example of one pixel included in FIG. 2 equivalent circuit which is driven by an active matrix circuit structure.

As shown in the enlarged pixel 20 in FIG. 3, a gate electrode of a switch transistor 21 constituted by an N channel type TFT is connected to the gate line 8, one of the source electrode and the drain electrode of the switch transistor 21 is connected to the data line 7 and the other electrode thereof is connected to one terminal of a capacitor 23. The one terminal of the capacitor 23 is also connected to the gate electrode of a driver transistor 22 constituted by another N channel type TFT.

The source electrode of the driver TFT 22 is connected to a common potential line 9 which extends to the same direction as that of the data lines 7 and the drain electrode thereof is connected to one of two electrodes of an OLED 24. The other electrode of the OLED 24 is connected to one of current supply lines 10 which are common to all of the pixels 20 and is kept at a predetermined potential Va. The OLED 24 is usually configured in such a manner that the anode thereof is formed by a transparent electrode, and the light emitted from its OLED layer is taken out toward outside through a glass substrate 6 on which the TFTs are formed.

In this circuit structure, when the switch transistor 21 is rendered into an ON state by a scanning signal applied on one of the gate lines 8 such as G1, G2, . . . , Gm, picture image signals from the data lines 7 such as D1, D2, . . . , Dn are written into the capacitors 23 through respective switch transistors 21. Therefore, the potentials of the gate electrodes of the respective driver transistors 22 are kept at those corresponding to the picture image signals by the respective capacitors 23, even when the respective switch transistors 21 are rendered into an OFF state.

Thus, the driver transistors 22 are continuously kept at their driving state under the source grounded mode which is excellent with regard to constant current characteristic, and a predetermined current from the current supply lines 10 is flown to the OLEDs 24. Therefore, the OLEDs are kept at their light emitting state. The light emission intensity at this moment depends on the picture image data written into the capacitors 23. The light emission interruption is achieved by rendering the driver transistors 22 into an OFF state.

Now, a method of driving the picture image display device will be explained with reference to FIGS. 4 and 5.

Figure 4:
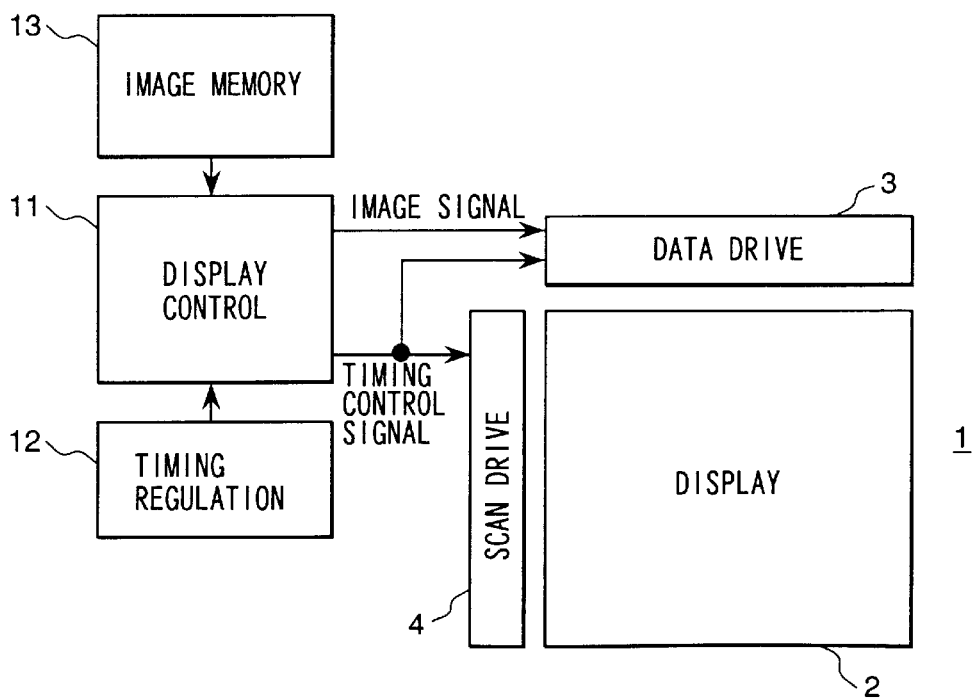
FIG. 4 is a block diagram for explaining an embodiment according to the present invention.

FIG. 4 shows a block diagram of a driving device which drives the picture image display device according to the present invention.

In FIG. 4, the portions bearing the same reference numerals as in FIG. 1 show those corresponding thereto. A display control controller 11 provides timing control signals (clock signals) to the data line drive circuit 3 and the scanning line drive circuit 4. The data line drive circuit 3 is further provided with picture image signals from the display control controller 11.

The timing (clock frequency) of the display control controller 11 is regulated by a timing regulation circuit 12. The timing regulation circuit 12 sets a clock frequency which corresponds to a quadruple of the base frequency for one frame. Thereby, the display control controller 11 quadruples the data reading speed from a picture image memory 13, and sets the timing of frame start control signals for shift registers in the both drive circuits 3 and 4 at t=0, Tf/4, Tf, 5Tf/4 . . . .

In the above explained structure, gate voltages VG1, VG2, . . . , VGm as illustrated in FIG. 5 which successively turn on the switch transistors 21 are applied from the scanning line drive circuit 4 to the gate lines G1, G2, . . . , Gm, and the gate voltages VG1, VG2, . . . , VGm vary from a low voltage level VGL to a high voltage level VGH.

On the other hand, in synchronism with the gate voltages VG1, VG2, . . . , VGm the data voltages VD1, VD2, . . . , VDn representing picture image signals are applied from the data line drive circuit 3 to the data lines D1, D2, . . . , Dn. The picture image signal voltages VD1, VD2, . . . , VDn are set between a high voltage level VDH and a low voltage level VDL. The low voltage level VDL is usually set below the voltage of the common potential lines 9. The voltage Va of the current supply lines 10 and the voltage of the common potential lines 9 are kept constant.

Although the picture image display device is driven in the manner as explained above, the present driving method employs line-at-a-time sequential scanning like a conventional art.

Now, according to the present invention, a period required for scanning one picture or one picture image is shortened to ¼ of the one frame period Tf. Accordingly the selection time per one gate line 8 is likely shortened to Tf/4m. After being completed scanning of one picture and subsequently when the gate line G1 is again selected, data voltages VD1, VD2, . . . , VDn having voltage value VDL which renders the driver transistors 22 into an OFF state are applied all of the data lines D1, D2, . . . , Dn.

Under this voltage application scheme, about ¼ of one frame period assumes a light emitting period and the remaining ¾ period thereof assumes a quenching period (no light emitting period). In order to prevent a dark display image due to the shortening of effective light emitting time of the OLEDs 24 the peak value of the data voltage is determined to flow a quadruple current. Since a value of the one frame period Tf is about 16 ms, the period used for the light emission is about 4 ms, and because of the high speed response characteristics of the OLEDs 24 the light emission can be performed over the almost entire period of about 4 ms.

How the blurred edges of motion pictures is suppressed, when the picture image display device is driven in a manner as explained above, will be explained hereinbelow.

At first, in order to facilitate understanding of the characteristic of the present invention, how the blurred edges of motion pictures occurs will be explained with reference to FIGS. 6A and 6B.

Figure 6A:
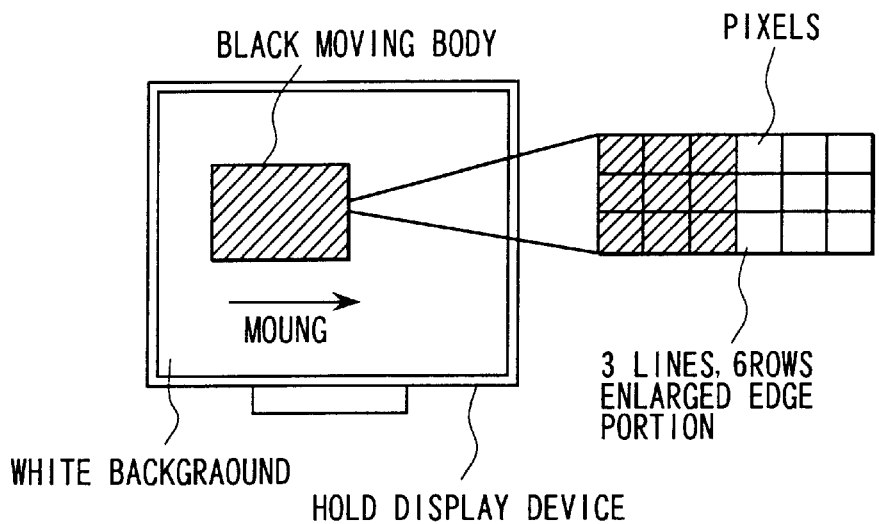
FIGS. 6A and 6B are diagrams for explaining blurred edges of motion pictures with a conventional pixel driving method.

As illustrated in FIG. 6A, a video image is assumed, in which a black rectangular shape representing a motion picture image moves with a constant speed in a white background in the arrowed direction from left to right in the drawing. When this motion picture image is displayed through a hold type display device, the display contents are rewritten every one frame interval and the display contents are held over the one frame period. Noting these two features, FIG. 6B is prepared while enlarging one horizontal line including an edge portion of the motion picture image.

Figure 6B:
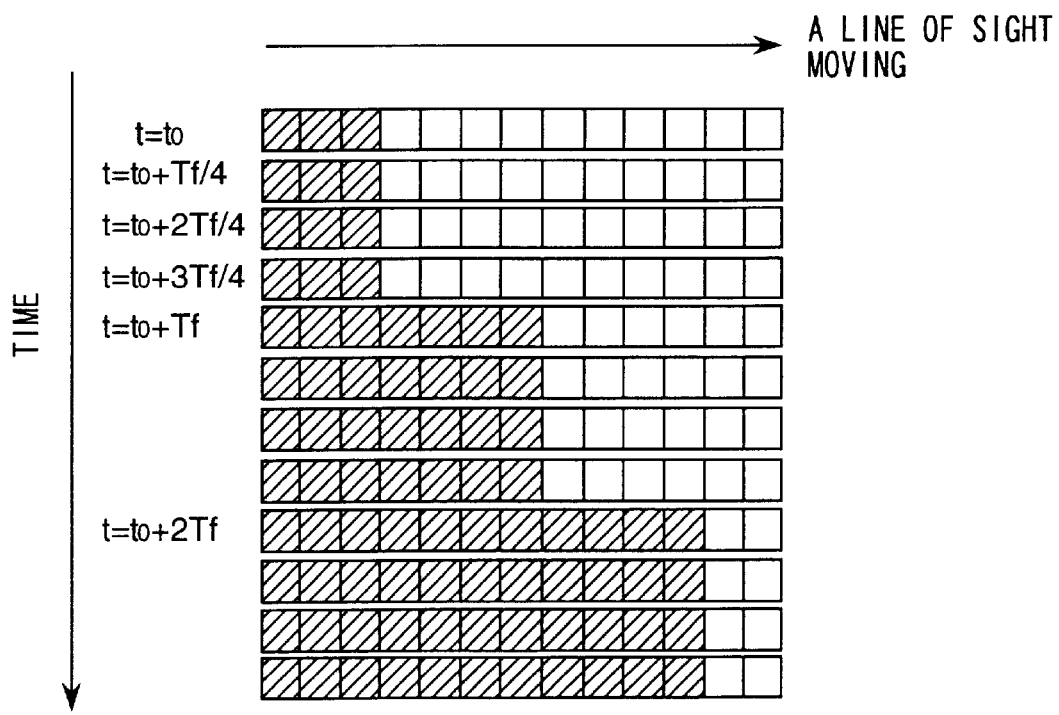

Namely, FIG. 6B schematically shows a change of the enlarged portion with regard to time for every Tf/4. As illustrated in FIG. 6B, the edge portion of the rectangular shape is displayed while moving in step wise with respect to passage of time. FIG. 6B shows an example in which the edge portion moves by four pixels for every one frame.

The eyes of a user which view this display picture, in that line of sight moves continuously following the motion picture image as illustrated by the arrow A in FIG. 6B. During the movement of the line of sight, since the white background is also recognized, the brightness signal of the motion image of the motion picture image of which the user perceives corresponds to an integration value of the white background signals and the black signals, which causes to blur the edge portion of the black rectangular shape.

Figure 7:
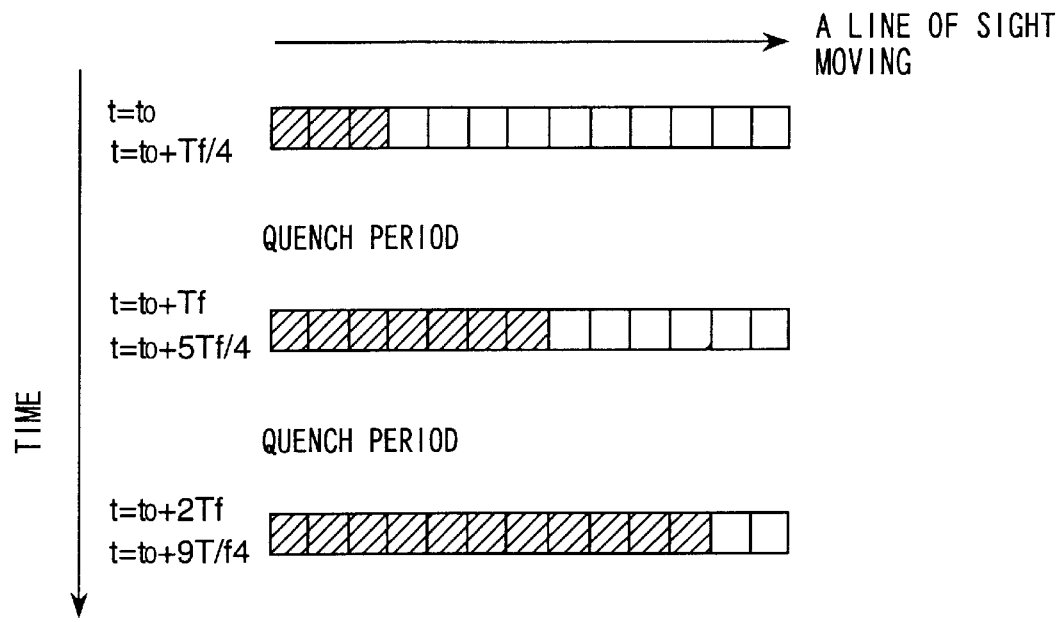
FIG. 7 is a diagram for explaining how blurred edges of motion pictures is eliminated according to the present invention.

On the other hand, FIG. 7 shows the pixels in one line in FIG. 6B with respect to passage of time for explaining how the picture image is viewed when the pixel driving method according to the present invention is applied.

In FIG. 7, for example, during a period from time t=t0+Tf/4 to t=t0+Tf the light emission is quenched, therefore, at the time of the line of sight movement during this quenching period an integration of white background is eliminated because of no white background signals, resultantly, no blurred edges occurs, namely, display characteristics of motion picture are greatly improved.

Further, in the above embodiment the ratio of 1:3 between light emitting period and light quenching period was used. However, in view of no picture quality deterioration in display characteristics of a CRT viewing afterglow below 3 ms of a luminescent body and showing sufficient motion picture image display characteristics, the light emitting period can be further shortened with the timing regulation circuit 12 so as to reduce power consumption.

Figure 8:
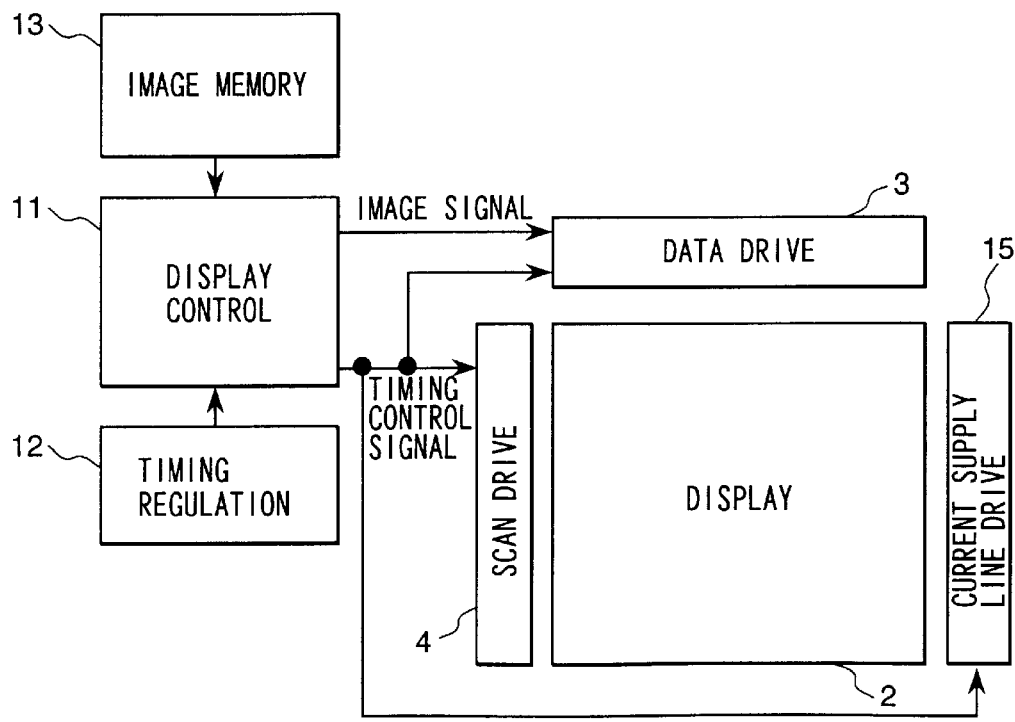
FIG. 8 is a block diagram for explaining another embodiment according to the present invention.

FIG. 8 shows another embodiment according to the present invention.

Figure 9:
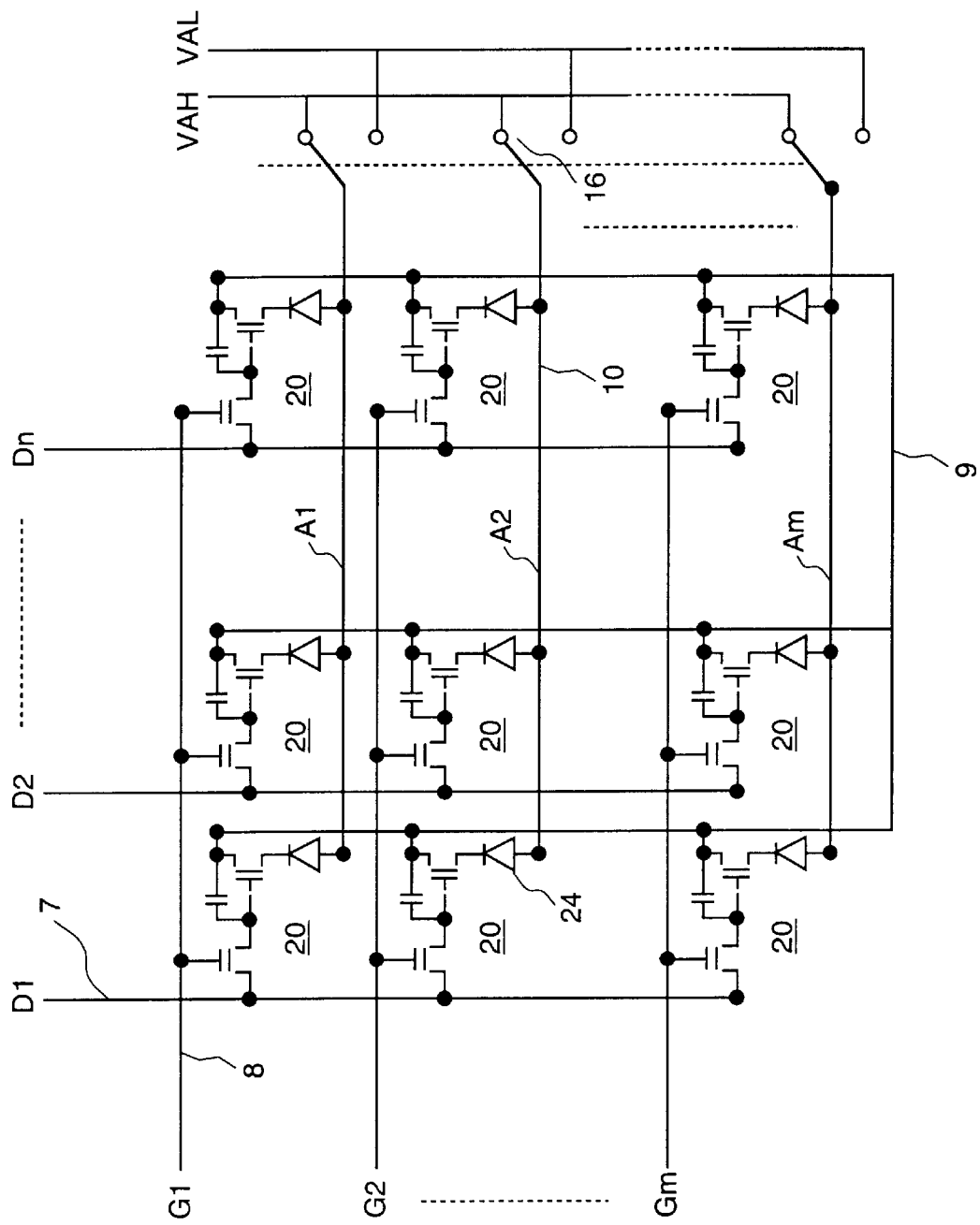
FIG. 9 is an equivalent circuit diagram of an active matrix type display unit included in FIG. 8 embodiment according to the present invention.

In FIG. 8, a different point from FIG. 4 embodiment is that a current supply line drive circuit placed under control of the display controller 11 is provided in place of the current supply drive circuit 5. As shown in FIG. 9, for the respective current supply lines 10 switches 16 are provided which change over supply voltages for the current supply lines 10 between VAH and VAL in association with the gate voltages for light quenching.

FIG. 9 shows a pixel matrix diagram in the display portion 2. A different point in FIG. 9 from that in FIG. 2 is that respective separate current supply lines A1, A2, . . . , Am are provided which bundle anode electrodes of the OLEDs 24 for every line and voltages VA1, VA2, . . . , VAm each including a plurality of voltages such as VAH and VAL other than a single constant voltage are applied to the respective current supply lines A1, A2, . . . , Am via the respective switches 16.

Figure 10:
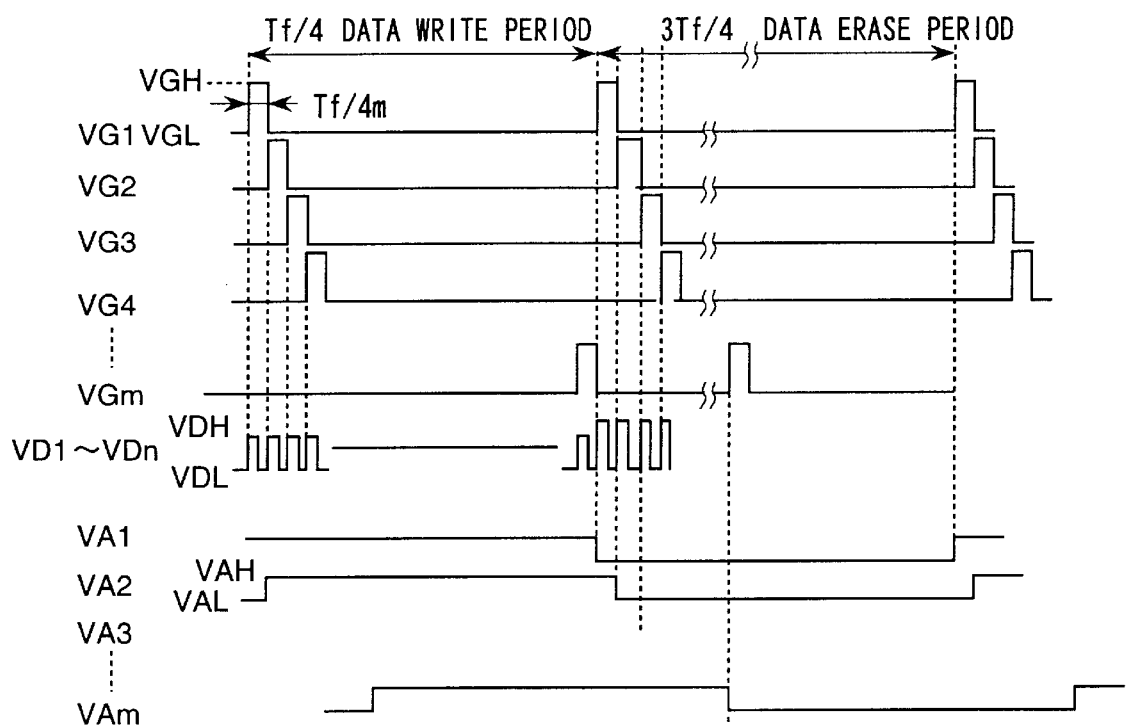
FIG. 10 is a time chart for explaining a pixel driving operation of FIG. 8 embodiment according to the present invention.

An operation of this circuit structure will be explained with reference to the time chart as shown in FIG. 10. Since the purpose of providing the light emitting period and the light quenching period for driving the pixels in the present embodiment is substantially the same as that in FIG. 4 embodiment, the detailed explanation of which is omitted.

However, in the present embodiment, after completing the light emitting period for one frame, at the timing of reselection of the gate lines 8 a voltage is applied to the driver transistors 22 which turns on the same in a non-saturated region thereof and at the same time the voltages VA1, VA2, . . . , VAm provided to the current supply lines A1, A2, . . . , Am by the current supply line drive circuit 15 are reduced to the low voltage level VAL. The low voltage level VAL is set lower than the voltage level of the common potential lines 9.

When the voltages VA1, VA2, . . . , VAm at the current supply lines A1, A2, . . . , Am are reduced to the low voltage level VAL, the potential of the pixel electrodes of the OLEDs 24 assumes about the voltage level of the common potential lines 9, thereby, the voltage between the both ends of the OLEDs 24 shows an inverted bias direction as that during the light emission. Therefore, when the driver transistor 22 is turned off at this moment, the above bias voltage application condition is held over the light quenching period. Such inverted or backward bias voltage application can be realized, because the current supply lines 10 in a stripe shape are arranged in parallel with the gate lines 8.

If a DC forward bias is continuously applied to an OLED 24, such as space charge is gradually generated therein which reduces the brightness thereof. However, when an inverted bias as in the present embodiment is applied to the OLED 24, the generation of the space charge is prevented which prolongs the life time of the OLED 24.

Figure 11:
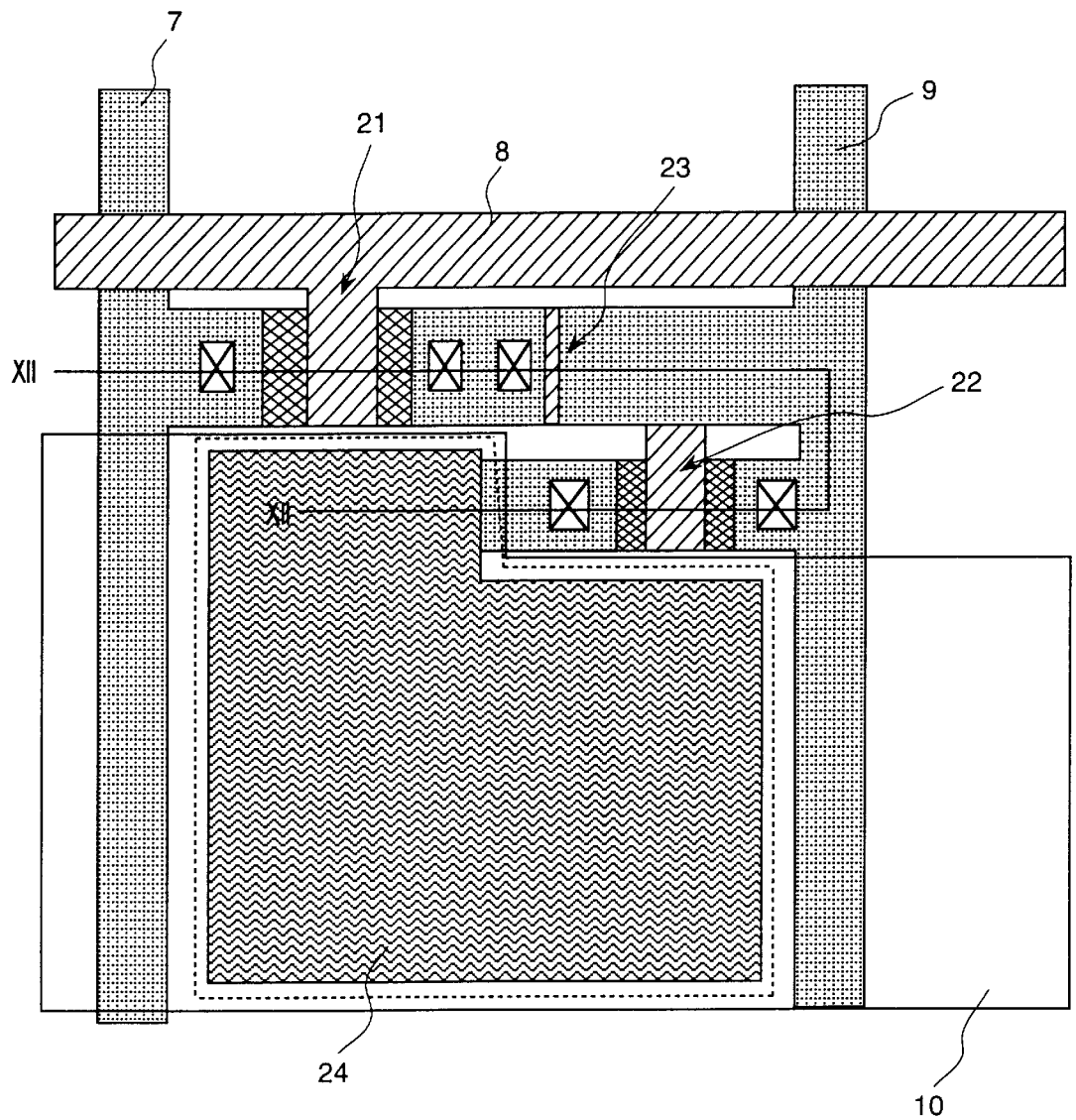
FIG. 11 is a view for explaining a plane structure of a pixel portion in a picture image display device according to the present invention.
Figure 12:
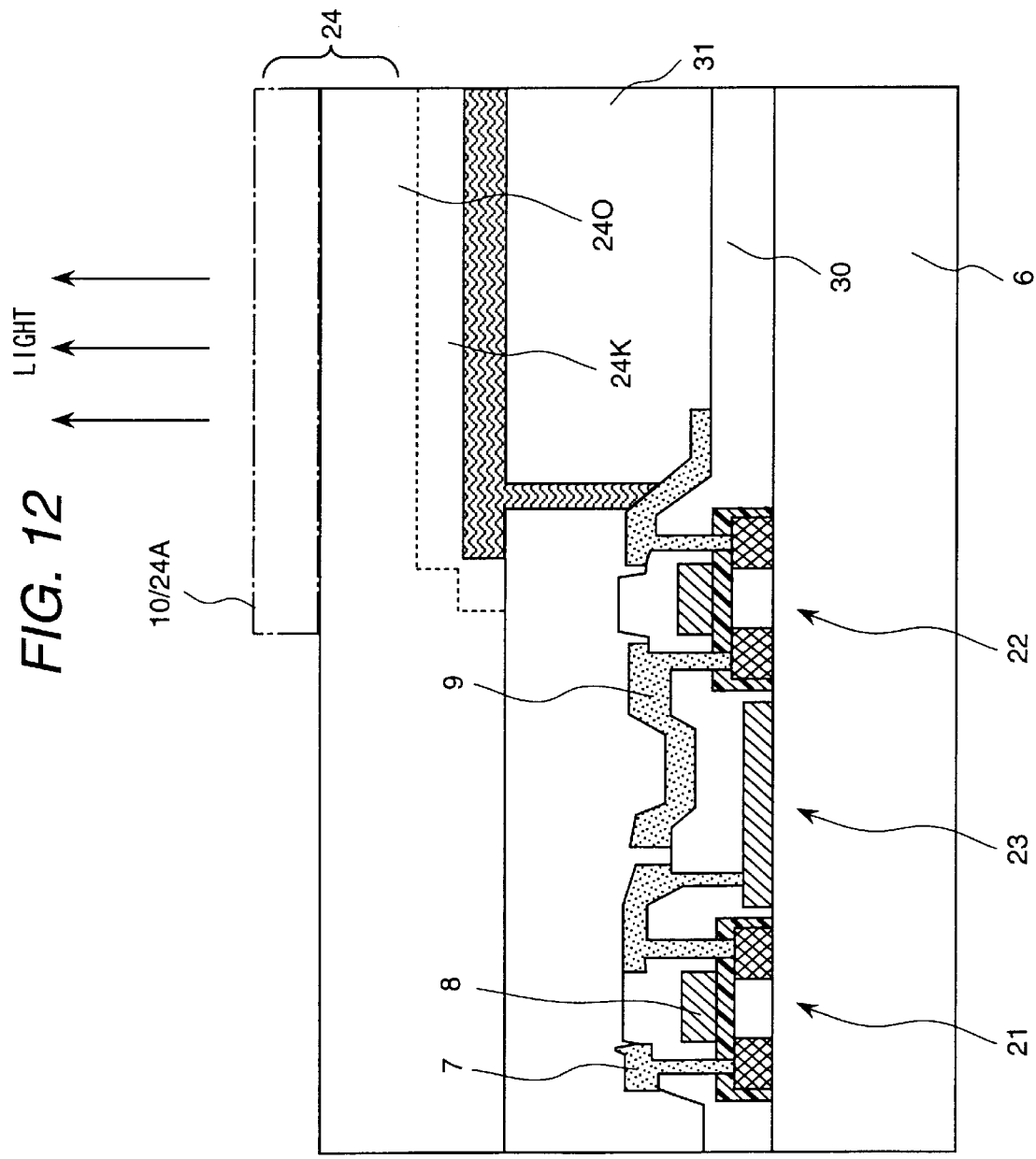
FIG. 12 is a cross sectional view taken along the line XII—XII in FIG. 11.

The formation of the stripe shaped current supply lines 10 in FIGS. 8 and 9 embodiment will be explained with reference to FIGS. 11 and 12. FIG. 11 shows a plane structure of the pixel portion in the picture image display device 1 and FIG. 12 shows a cross sectional view taken along the line XII—XII in FIG. 11.

On the glass substrate 6, in order to constitute the switch transistor 21 and the driver transistor 22, a silicon film in island shapes is formed, and on the surface of the silicon film a gate insulation film is formed. On the gate insulation film gate electrodes and the gate line 8 are formed, thereafter, the source and drain regions for the switch transistor 21 and the driver transistor 22 are formed in a self aligned manner with respect to the gate electrodes. Then, a first inter layer insulation film 30 is provided and the data line 7, the common potential line 9 and an electrode for the capacitor 23 are formed via contact holes.

Further, after providing a cathode 24K of the OLED 24 representing the pixel electrode via a contact hole in a second inter layer insulation film 31 and an organic layer 240 thereof, a transparent anode electrode 24A representing an opposing electrode of the OLED 24 and the current supply line 10 connected therewith are provided. The current supply line 10 is extended in the line direction, namely in the extending direction of the gate line 8.

The OLED light emitting element 24 is structured by laminating the cathode 24K which is constituted by a metal layer such as aluminum or calcium containing lithium and is connected over a metal layer connected to the drain of the driver transistor 22, the organic semiconductor layer 240, a hole injecting layer and a transparent anode electrode 24A constituted by an oxide film containing indium.

Figure 13:
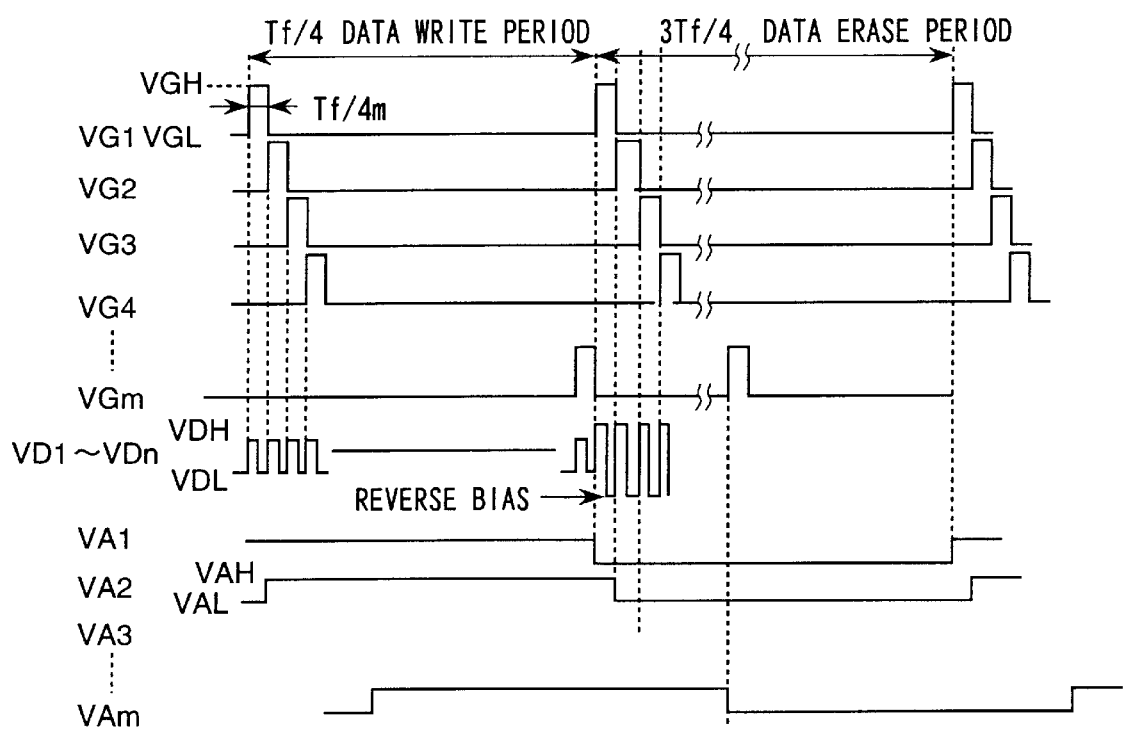
FIG. 13 is a time chart for explaining a pixel driving operation of still another embodiment according to the present invention.

FIG. 13 shows a modified method of driving FIG. 8 embodiment. When comparing FIG. 14 driving method with FIG. 10 driving method, it will be apparent that with regard to the drive voltage waveform the ratio between light emitting period and light quenching period in one frame is set at 1:3 and the voltages VA1, VA2, . . . , VAm for the current supply lines 10 are rendered to the low voltage level VAL during the light quenching period like FIG. 10 driving method.

In FIG. 13 driving method, with regard to the data line drive voltage when turning off the driver transistors 22 after applying the turn-on voltage to the driver transistors 22 in synchronism with the gate reselection pulses, a voltage further lower than the voltage level VDL is applied, in that the feature of FIG. 13 driving method is, in particular, to lower the voltage level for turning off the driver transistors 22 below the potentials such as the common potential lines 9 and the pixel electrodes.

Under the above condition when the voltage for the gate lines 8 is rendered into a non-selection state, the gate voltage of the driver transistors 22 is kept lower than the source and drain voltages. Namely, the driver transistors 22 which are driven by a positive gate voltage during light emitting operation is applied of a negative gate voltage during light quenching operation, thereby, a performance shift of the transistors due to electric charge injection into the gate insulation films thereof and a deterioration of display picture quality in association therewith can be prevented.

As has been explained hitherto, in the picture image display device according to the present invention since the pixels are designed to be driven while interposing the light quenching period in which the electro optical elements are quenched after scanning a plurality of gate lines for displaying one picture image, the integration of the conventional white background at the time of line of sight movement is eliminated during the light quenching period, therefore, the blurred edges, namely the display property of the motion pictures is greatly improved.

Further, in the above embodiments, since the scanning for the light quenching is performed after completing the light emission scanning, the display property of the motion pictures can be improved without modifying a pixel circuit arrangement usually employed for an active matrix type drive.

Still further, since a reverse or inverted bias is applied to the OLEDs 24 during the light quenching period, the space charge generation therein is prevented to prolong the life time of the OLEDs 24, thereby, a picture image display device with a small brightness deterioration can be realized.

Still further, the present invention is not limited to the above explained embodiments. For example, the present invention can be applied to a modification of FIGS. 11 and 12 structure in which a P channel type TFT is used for the driver transistor 22 and the light is taken out from the side of the glass substrate 6.

Still further, in the above explained embodiments the light quenching period is formed in which the electro optical elements are quenched in one frame period for displaying one picture image, however, it will be apparent that it is sufficient in principle if a light quenching period in which the electro optical elements are quenched is introduced after scanning a plurality of gate lines for displaying one picture image.

As has been explained hitherto, according to the present invention since the pixels are driven while forming the light quenching period in which the electro optical elements are caused to be quenched after scanning a plurality of gate lines for displaying one picture image, the conventional integration of the white background is eliminated when the line of sight moves during this light quenching period, thereby, the blurred edges is prevented, namely, the display property of motion pictures is greatly improved.

What is claimed is:

1. A method of driving a picture image display device which comprises pixels formed in a matrix shape defined by a plurality of gate lines and a plurality of data lines crossing thereto and each including an organic light emitting diode and a switching element, wherein the pixels are driven while introducing a light quenching period formed by applying light quenching signals to the plurality of data lines in synchronism with scanning signals applied to the plurality of gate lines in a second period following a first period in a frame for displaying a motion picture image so as to quench the concerned organic light emitting diodes, after the plurality of gate lines are scanned for displaying one picture image.

2. A method of driving an active matrix type picture image display device which comprises pixels formed in a matrix shape defined by a plurality of gate lines and a plurality of data lines crossing thereto and each including an organic light emitting diode and a switching element, wherein the pixels are driven while introducing a light quenching period formed by applying light quenching signals to the plurality of data lines in synchronism with scanning signals applied to the plurality of gate lines in a second period following a first period in a frame for displaying a motion picture image so as to quench the concerned organic light emitting diodes, in one frame period for displaying one picture image.

3. A method of driving a picture image display device for displaying a motion picture image which comprises pixels formed in a matrix shape defined by a plurality of gate lines to which scanning signals are fed and a plurality of data lines crossing thereto to which picture image signals are fed and each including an organic light emitting diode and a thin film transistor, wherein the pixels are driven while introducing a light quenching period, in which the organic light emitting diode is caused to be quenched, by applying light quenching signals in synchronism with scanning signals so as to quench the concerned organic light emitting diodes, after applying scanning signals to the plurality of gate lines so as to cause the concerned organic light emitting diodes light emission.

4. A method of driving a motion picture image display device including a plurality of pixels arranged in a matrix shape defined by a plurality of gate lines and a plurality of data lines crossing to the plurality of gate lines, each pixel being constituted by a first thin film switch transistor coupled to one of the gate lines as well as one of the data lines, a second thin film driver transistor coupled to the first thin film switch transistor, a capacitor coupled both to the first thin film switch transistor and the second thin film driver transistor and an organic light emitting diode coupled to the second thin film driver transistor comprising:

applying data signals to the plurality of data lines in synchronism with scanning signals applied to the plurality of gate lines in a first period in one frame for displaying a motion picture image so as to cause concerned organic light emitting diodes light emission;

applying light quenching signals to the plurality of data lines in synchronism with scanning signals applied to the plurality of gate lines in a second period following the first period in the frame for displaying a motion picture image so as to quench the concerned organic light emitting diodes; and repeating the above sequence so as to display a motion picture image.

5. A method of driving a motion picture image display device according to claim 4, wherein the light quenching signal corresponds to a low voltage level data signal VDL.

6. A method of driving a motion picture image display device according to claim 4, wherein the quenching signal includes a first pulse voltage higher than a high voltage level data signal VDH which once permits to turn on the concerned second thin film driver transistor and a second pulse voltage corresponding to a low voltage level data signal VDL, and the method comprises applying a first voltage VAH to an anode of the concerned organic light emitting diode in synchronism with the data signal and further applying a second voltage VAL lower than the first voltage VAH in synchronism with the light quenching signal to the anode of the concerned organic light emitting diode until an application of a subsequent data signal.

7. A method of driving a motion picture image display device according to claim 4, wherein the quenching signal includes a first pulse voltage higher than a high voltage level data signal VDH which once permits to turn on the concerned second thin film driver transistor and a second pulse voltage lower than a low voltage level data signal VDL, and the method comprises applying a first voltage VAH to an anode of the concerned organic light emitting diode in synchronism with the data signal and further applying a second voltage VAL lower than the first voltage VAH in synchronism with the light quenching signal to the anode of the concerned organic light emitting diode until an application of a subsequent data signal.

8. A method of driving a picture image display device for displaying motion picture images according to claim 3, wherein the driving method enables prevention of a blurred edge of the motion picture image.

9. A method of driving a picture image display device for displaying motion picture images according to claim 3, wherein the light quenching period is introduced in one frame period for displaying one picture image.

10. A method of driving a picture image display device for displaying motion picture images according to claim 3, wherein the light quenching period is introduced between two frame periods for displaying the picture images.

11. A method of driving a picture image display device for displaying motion picture images according to claim 3, wherein a backward bias is applied to the quenched electro optical elements in the light quenching period.

* * * * *